United States Patent
Khoury (10) Patent No.: US 9,267,718 B2
(45) Date of Patent: Feb. 23, 2016

(54) TEMPERATURE CONTROL SYSTEM AND METHOD

(75) Inventor: Antoine Henein Khoury, Bellingham, MA (US)

(73) Assignee: Khoury Industries Incorporated, Bellingham, MA (US)

( * ) Notice: Subject to any disclaimer, the term of this patent is extended or adjusted under 35 U.S.C. 154(b) by 361 days.

(21) Appl. No.: 12/244,956

(22) Filed: Oct. 3, 2008

(65) Prior Publication Data

US 2009/0093914 A1 Apr. 9, 2009

Related U.S. Application Data

(60) Provisional application No. 60/977,711, filed on Oct. 5, 2007, provisional application No. 61/038,929, filed on Mar. 24, 2008.

(51) Int. Cl.
  *F25B 41/04* (2006.01)
  *F25B 49/02* (2006.01)
  *G01R 31/28* (2006.01)

(52) U.S. Cl.
  CPC ............. *F25B 41/043* (2013.01); *F25B 49/02* (2013.01); *F25B 2400/01* (2013.01); *F25B 2600/02* (2013.01); *F25B 2600/112* (2013.01); *G01R 31/2874* (2013.01); *Y02B 30/743* (2013.01)

(58) Field of Classification Search
  CPC .................................................... F25B 41/043
  USPC .............. 62/229, 196.1, 217, 196.3; 165/263, 165/264
  See application file for complete search history.

(56) References Cited

U.S. PATENT DOCUMENTS

| | | | | |
|---|---|---|---|---|
| 2,731,805 | A * | 1/1956 | Kuhn ............................... | 62/164 |
| 3,637,006 | A * | 1/1972 | Decker ......................... | 165/264 |
| 4,729,246 | A * | 3/1988 | Melgaard et al. ............ | 73/865.6 |
| 4,812,750 | A * | 3/1989 | Keel et al. ................. | 324/750.03 |
| 5,211,713 | A * | 5/1993 | Suyama ........................ | 165/259 |
| 5,331,273 | A | 7/1994 | Schneider ................. | 324/158.1 |
| 5,477,915 | A * | 12/1995 | Park ............................... | 165/206 |
| 5,977,785 | A * | 11/1999 | Burward-Hoy .......... | 324/750.09 |
| 7,918,097 | B2 * | 4/2011 | Kim et al. ..................... | 62/196.1 |
| 2005/0193957 | A1* | 9/2005 | Oshima et al. ............... | 119/300 |
| 2007/0240872 | A1* | 10/2007 | Hayashi et al. ............... | 165/254 |
| 2010/0011792 | A1* | 1/2010 | Lifson et al. ..................... | 62/222 |

* cited by examiner

*Primary Examiner* — Marc Norman
*Assistant Examiner* — Devon Russell
(74) *Attorney, Agent, or Firm* — Sunstein Kann Murphy & Timbers LLP (57) ABSTRACT

In a temperature control system and method, a compressor is left on during steady state operation even when cooling is not needed, and an electronically controlled valve (e.g., a solenoid valve) is used to enable and disable the flow of coolant through a heat exchanger system in order to selectively control whether cooling is enabled or disabled. A flow of air may be passed through the heat exchanger system to cool the flow of air, and the valve may be controlled based at least in part on temperature of the flow of air, e.g., in accordance with a proportional-integral-derivative (PID) control scheme. A heater may be controlled to selectively heat the flow of air. A cooling cycle may be provided in which the heater is disabled and the flow of coolant is enabled via the valve, and a heating cycle may be provided in which the heater is enabled and the flow of coolant is disabled via the valve.

7 Claims, 7 Drawing Sheets

FIG. 1 (PRIOR ART)

FIG. 2    OPEN LOOP CONTROLLED AIR CIRCUIT (PRIOR ART)

FIG. 3   2ND STAGE REFRIGERANT CIRCUIT

FIG. 4    1ST STAGE REFRIGERANT CIRCUIT

TEMPERATURE CONTROL SYSTEM AND METHOD

CROSS-REFERENCE TO RELATED APPLICATIONS

This application claims priority from U.S. Provisional Patent Application No. 60/977,711 entitled INTERCHANGEABLE, REMOVABLE CHAMBER CAVITY FOR A CLOSED LOOP THERMAL FIXTURE filed Oct. 5, 2007 and from U.S. Provisional Patent Application No. 61/038,929 entitled TEMPERATURE CONTROL SYSTEM AND METHOD filed on Mar. 24, 2008, each of which is incorporated herein by reference in its entirety.

FIELD OF THE INVENTION

The present invention relates generally to temperature control systems, and, more particularly, to temperature control systems that provide for quickly activating and inactivating a cooling circuit.

BACKGROUND

It is often necessary or desirable to test components through a wide range of temperatures to ensure that operating and other parameters are met. For example, electrical, mechanical, electromechanical, and other types of components that are used in military applications are often tested through a temperature range of −55 degrees Celsius to +125 degrees Celsius. Other industries, such as automotive, aerospace, and medical may have other temperature testing requirements or guidelines. U.S. Pat. No. 5,331,273 provides an example of a thermal fixture for testing an integrated circuit.

Temperature control systems used for such temperature testing typically include both heating and cooling subsystems for controlling the air temperature within a chamber cavity of a thermal fixture. For example, the heating subsystem (referred to hereinafter as the "heater") may include a heating element, and the cooling subsystem (referred to hereinafter as the "refrigerator") may include a compressor arrangement (e.g., with a single compressor or with two cascaded compressors) that circulates coolant through an evaporator. A blower may be used to circulate air through the heating and cooling subsystems (e.g., past the heating element of the heater and through the evaporator of the refrigerator).

Figure 2:
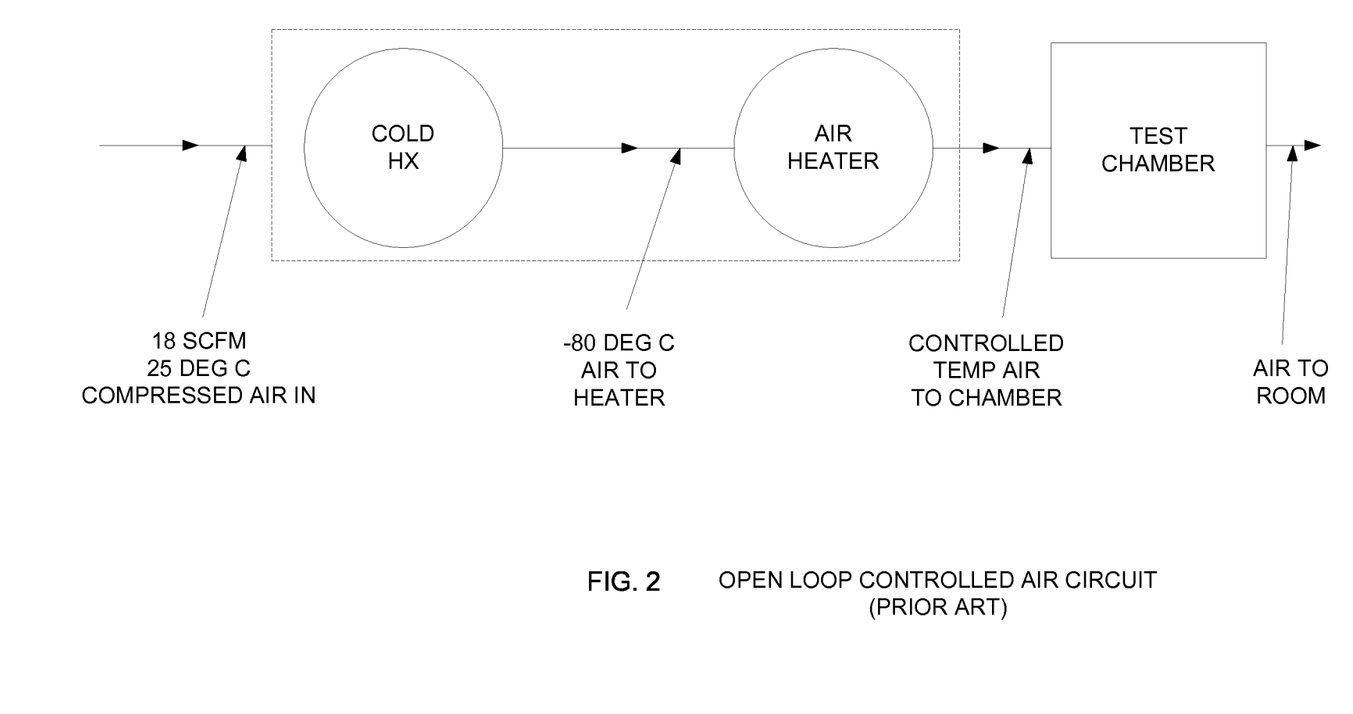
FIG. 2 is a schematic diagram showing a representation of an open-loop air circuit as known in the art.

As would be understood by the one skilled in the art, the thermal load of any heating-cooling system is primarily determined by the temperature differential that has to be overcome to either heat or cool the air from its current temperature to the control temperature (as well as thermal losses, if any). Open-loop systems often utilize a "reheat" approach to temperature control. FIG. 2 is a schematic diagram depicting a representative open-loop system. Here, the air is initially chilled to the lowest temperature required for the particular application (e.g., −80 deg C). Then, the chilled air is blown through the heater, reheated to the required control temperature, and passed into the temperature chamber, thus maintaining the required temperature-controlled environment. Thus, in this example, cooling is always on at max capacity and the heater is on as required to achieve and to maintain the temperature controlled air to the chamber. Finally, the used air is vented to the atmosphere. As a result, in a "reheat" temperature control method of the open-loop systems, the thermal load imposed by the air-heater on the refrigeration system generally increases progressively as the air temperature is increased, which can detrimentally affect the second stage of the cascade refrigeration system. When such thermal load exceeds a certain amount, the compressor of the cascade refrigeration system may malfunction and trip its overload protector.

Figure 1:
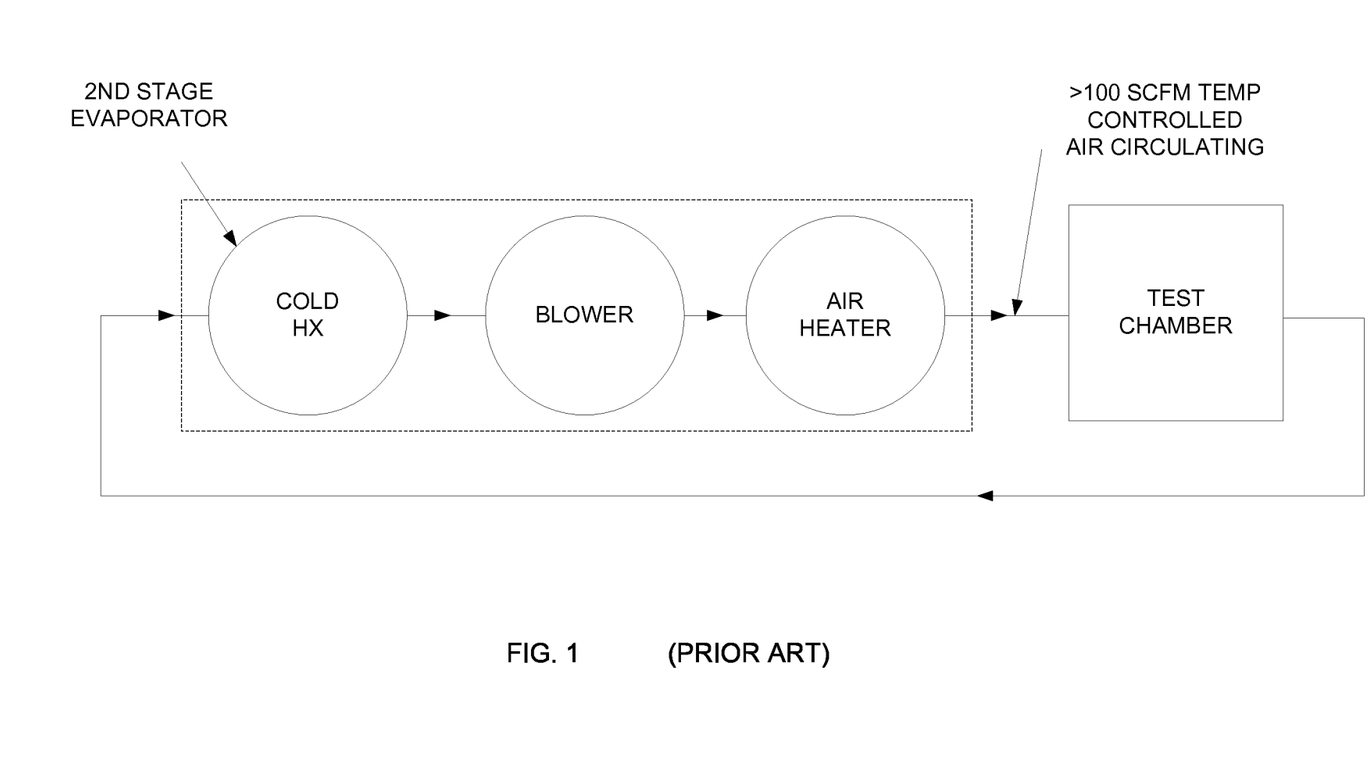
FIG. 1 is a schematic diagram showing a representation of a controlled closed-loop air circuit as known in the art.

To overcome such operational shortcoming of the conventional approach, some temperature control systems use a closed-loop system that recirculates the used air. FIG. 1 is a schematic diagram depicting a representative closed-loop system. Such a closed-loop system typically is configured with independent control of the heater and refrigerator, allowing the refrigerator to be turned off when heater is on and turned on only when temperature decrease is required. For example, in order to increase the air temperature, the heater may be enabled (e.g., the heating element turned on) while the refrigerator is disabled (e.g., the second stage compressor turned off), and in order to decrease the air temperature, the refrigerator may be enabled (e.g., the second state compressor turned on) while the heater is disabled (e.g., the heating element turned off). Thus, in this example, (1) during cooling, heater is "off" & cold hx is "on"; (2) during heating, heater is "on" & cold hx is "off"; and (3) when the chamber is at the test temperature, either the heater is "on" or the cold hx is "on" while the other is "off" as required to maintain the desired chamber temperature. The closed-loop system typically includes a PID controller that controls the heater and the refrigerator based on temperature feedback information. As a result, in a typical closed-loop system as shown in FIG. 1, the heater and the refrigerator operate, and can be controlled, independently and do not affect each other's operation.

In such temperature control systems, it is often necessary or desirable to switch quickly between heating and cooling. For example, a particular temperature testing regime may require quick temperature changes, and quick temperature changes may be desirable for reducing the amount of time required for a particular temperature test regime. As discussed above, to turn off the refrigerator when the heater is on in a closed-loop system, the power to the second stage of the cascaded compressor of FIG. 1 may be simply shut off (the first stage compressor may or may not remain on). This solution, however, may prove to be inadequate, for example, if the time required by the user to re-start the refrigerator and that warranted by the system significantly differ. For example, to restart the refrigeration cycle after the compressor has been shut-off, at least two minute time-delay is generally required, during which the pressure in the system compressor is appropriately stabilized to reach the required operational conditions. This limitation may be particularly stringent if the low-starting-torque compressors are used. The system user, however, may need to switch the operation from cooling to heating within seconds, not minutes.

SUMMARY OF THE INVENTION

In accordance with one aspect of the invention there is provided a thermal fixture comprising a compressor system for compressing a coolant; a heat exchanger system for at least selectively cooling a flow of air, the heat exchanger system including an evaporator in fluid communication with the compressor system via a coolant flow path through which the coolant can flow from the compressor system to the evaporator and back to the compressor system; and an electronically controllable valve disposed in the coolant flow path for selectively enabling and disabling the flow of coolant through the coolant flow path when the compressor system is running.

In various alternative embodiments, the electronically controllable valve may be a solenoid valve, a binary valve having a first selectable configuration that enables flow of coolant through the coolant flow path and a second selectable configuration that disables flow of coolant through the coolant flow path, or a variable valve. The compressor system may include a cascaded compressor arrangement having a first stage compressor and a second stage compressor that is in fluid communication with the evaporator via the coolant flow path. The thermal fixture may include a controller operably coupled to the valve for controlling the valve. The controller may be a proportional-integral-derivative (PID) controller that is configured to control the valve based at least in part on temperature of the flow of air. The controller may be configured to leave the compressor system running during stead state operation and to selectively enable and disable flow of coolant via the valve. The heat exchanger system may further include a heater operably coupled to the controller for selectively heating the flow of air. The controller may be configured to operate a cooling cycle in which the heater is disabled and the flow of coolant is enabled via the valve and to operate a heating cycle in which the heater is enabled and the flow of coolant is disabled via the valve. The thermal fixture may further include a chamber cavity in fluid communication with the heat exchanger system for receiving the flow of air from the heat exchanger system and recycling the flow of air back to the heat exchanger system. The chamber cavity may be interchangeable and removable.

In accordance with another aspect of the invention there is provided a temperature control method for a thermal fixture having a compressor system for compressing a coolant, a heat exchanger system including an evaporator in fluid communication with the compressor system via a coolant flow path through which the coolant can flow from the compressor system to the evaporator and back to the compressor system, and an electronically controllable valve disposed in the coolant flow path for selectively enabling and disabling the flow of coolant through the coolant flow path when the compressor system is running. The temperature control method involves leaving the compressor system running during steady state operation; and controlling the valve to selectively enable and disable the flow of coolant through the coolant flow path, whereby cooling is controlled via the valve without turning off the compressor system.

In various alternative embodiments, the method may involve passing a flow of air through the heat exchanger to cool the flow of air. The method may involve controlling the valve based at least in part on temperature of the flow of air in accordance with a proportional-integral-derivative (PID) control scheme. The method may involve controlling a heater of the heat exchanger system to selectively heat the flow of air. Controlling the valve and the heater may involve, in a cooling cycle, disabling the heater and enabling the flow of coolant via the valve, and in a heating cycle, enabling the heater and disabling the flow of coolant via the valve.

BRIEF DESCRIPTION OF THE DRAWINGS

The foregoing features of the invention will be more readily understood by reference to the following detailed description, taken with reference to the accompanying drawings, in which.

DETAILED DESCRIPTION OF SPECIFIC EMBODIMENTS

In exemplary embodiments of the present invention, rather than turning the compressor(s) off when cooling is not needed and turning the compressor(s) back on when cooling is needed, the compressor(s) is/are left on during steady state operation even when cooling is not needed, and an electronically controlled valve (e.g., a solenoid valve) is used to control the flow of coolant through the evaporator in order to selectively control whether cooling is enabled or disabled. By leaving the compressor(s) on and controlling the coolant flow using a valve, compressed coolant is readily available to be circulated through the evaporator when coolant flow is enabled (e.g., by opening the valve), so cooling essentially can be enabled and disabled quickly.

Thus, in an exemplary embodiment, the temperature control system includes, among other things, a compressor arrangement having one or more compressors in communication with an evaporator via a coolant flow path, an electronically controlled valve disposed in the coolant flow path for selectively enabling and disabling coolant flow through the coolant flow path, and a controller configured to leave the compressor(s) on during steady state operation and control the valve as needed to turn cooling on and off. Typically, the valve is opened to allow coolant to circulate through the evaporator and is closed to prevent coolant from circulating through the evaporator. The valve may operate in a binary fashion (e.g., can be cycled by the controller from a fully opened position to a fully closed position), although it should be noted that, in various alternative embodiments, a variable valve may be used to allow for more adjustable control of coolant flow. Such temperature control systems may be used in open-loop thermal fixtures or closed-loop thermal fixtures. In one specific embodiment, a temperature control system of the type just described is used in a closed-loop thermal fixture of the type described in U.S. Provisional Patent Application No. 60/977,711, which was incorporated by reference above.

Figure 5:
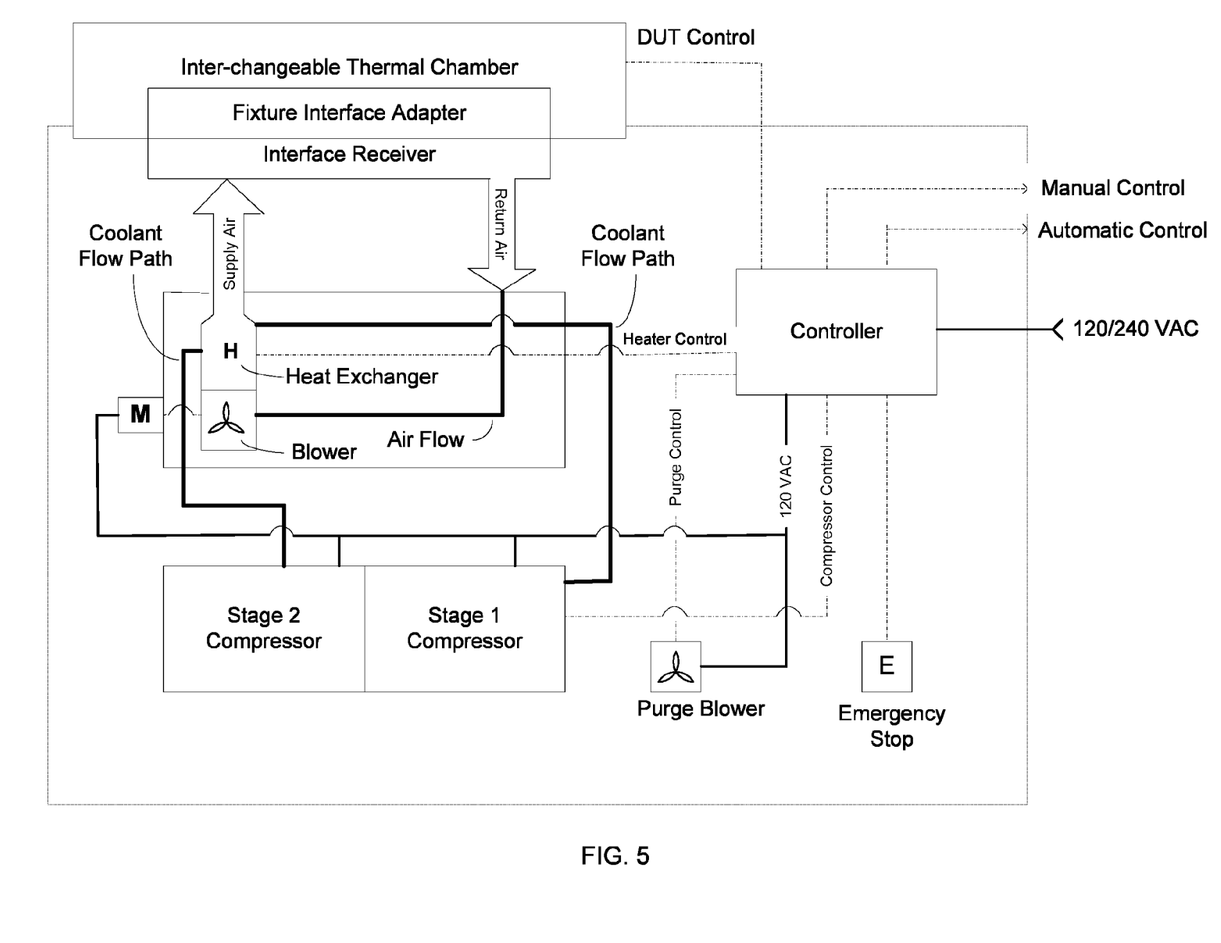
FIG. 5 is a schematic diagram showing the general architecture of a closed-loop fixture in accordance with an exemplary embodiment of the invention.

FIG. 5 is a schematic diagram showing the general architecture of a closed-loop fixture in accordance with an exemplary embodiment of the invention. In the embodiment of FIG. 5, the system is configured as a single package consisting of a small cascade refrigeration system, a blower, a proportional-integral-derivative (PID) temperature controller, and a low wattage air heater. This embodiment typically uses a 120 VAC 20-amp (actual usage is approximately 15 amps) power source. In operation, a relatively significant air-flow (typically, greater than 100 SCFM) is heated or cooled, and blown into the chamber to bring the temperature of the chamber and its contents (i.e., DUT) to the desired control temperature. This air then exits the chamber and is re-circulated to be heated or cooled again, as required. Because of the large air volume blowing through the chamber, no baffles or folds within the internal chamber are normally required to attain good temperature uniformity within the chamber. The embodiment allows for temperature control of either the chamber air or the device-under-test (DUT), or both.

Figure 3:
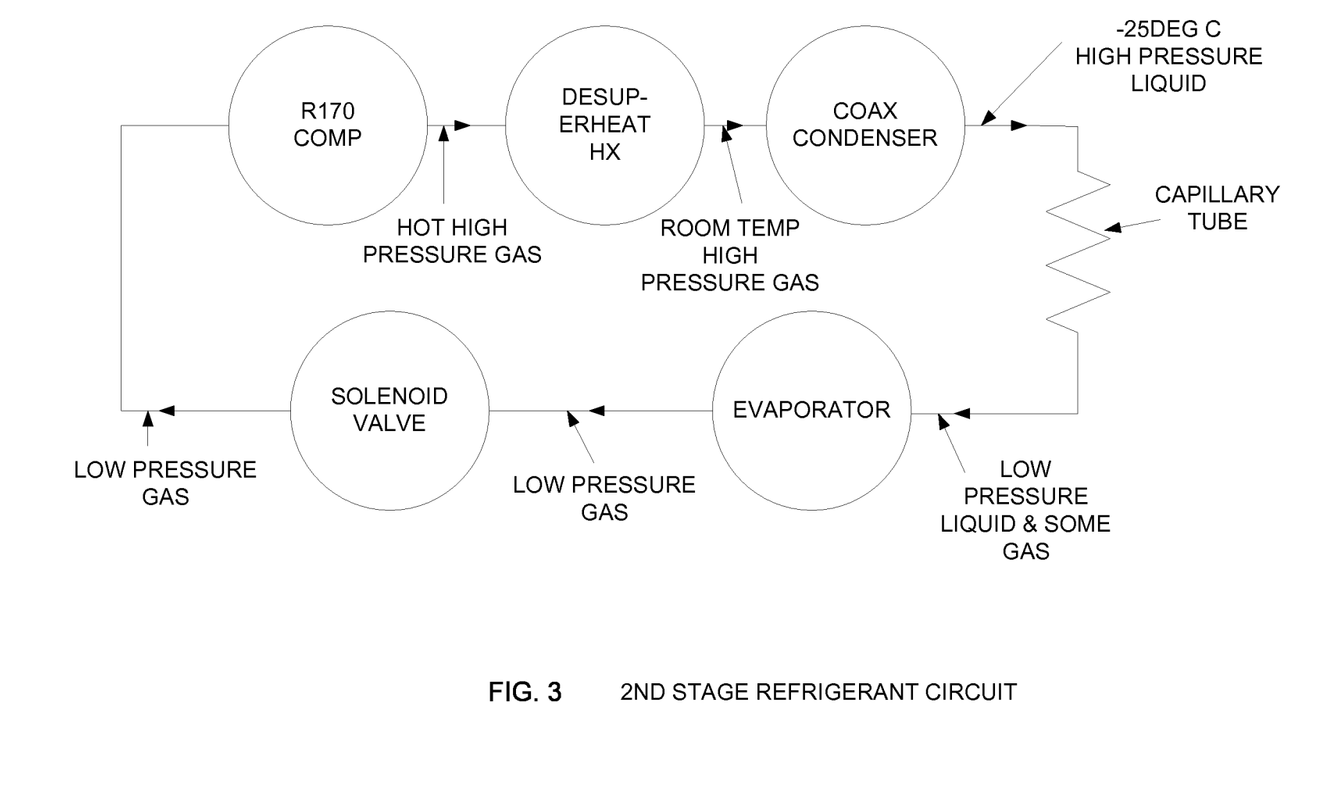
FIG. 3 is a schematic diagram showing a second stage refrigerant circuit of a cascaded compressor arrangement in accordance with an exemplary embodiment of the invention.
Figure 4:
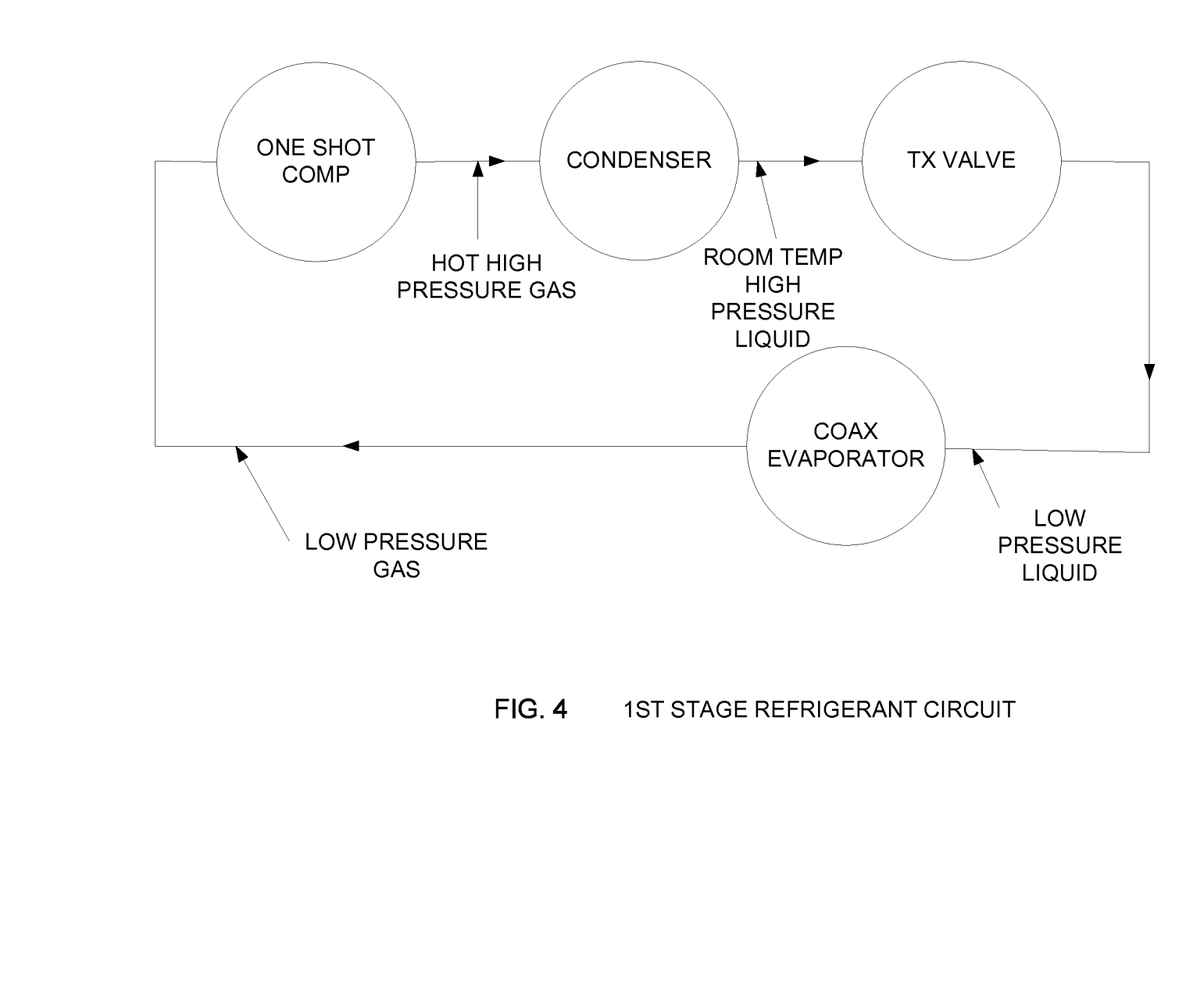
FIG. 4 is a schematic diagram showing a first stage refrigerant circuit of a cascaded compressor arrangement in accordance with an exemplary embodiment of the invention.

FIGS. 3 and 4 are schematic diagrams of the second stage refrigerant circuit and the first stage refrigerant circuit, respectively, in accordance with an exemplary embodiment of the invention. As shown in FIG. 3, the second stage refrigerant circuit includes a solenoid valve in the coolant flow path from the evaporator back to the compressor. The solenoid valve is operated by the controller (not shown in FIG. 3). The component labeled DESUPERHEAT HX is part of the condenser shown in FIG. 4. The component labeled COAX EVAPORATOR in FIG. 4 is in heat exchange with the COAX CONDENSER shown in FIG. 3. In this example, (1) air to control the test chamber is cooled by the refrigerant evaporator; (2) the temperature controller opens the solenoid valve and permits refrigerant to flow through and evaporate in the evaporator (refrigerant evaporation cools the air); and (3) when the solenoid valve is open the air heater is off.

Figure 7:
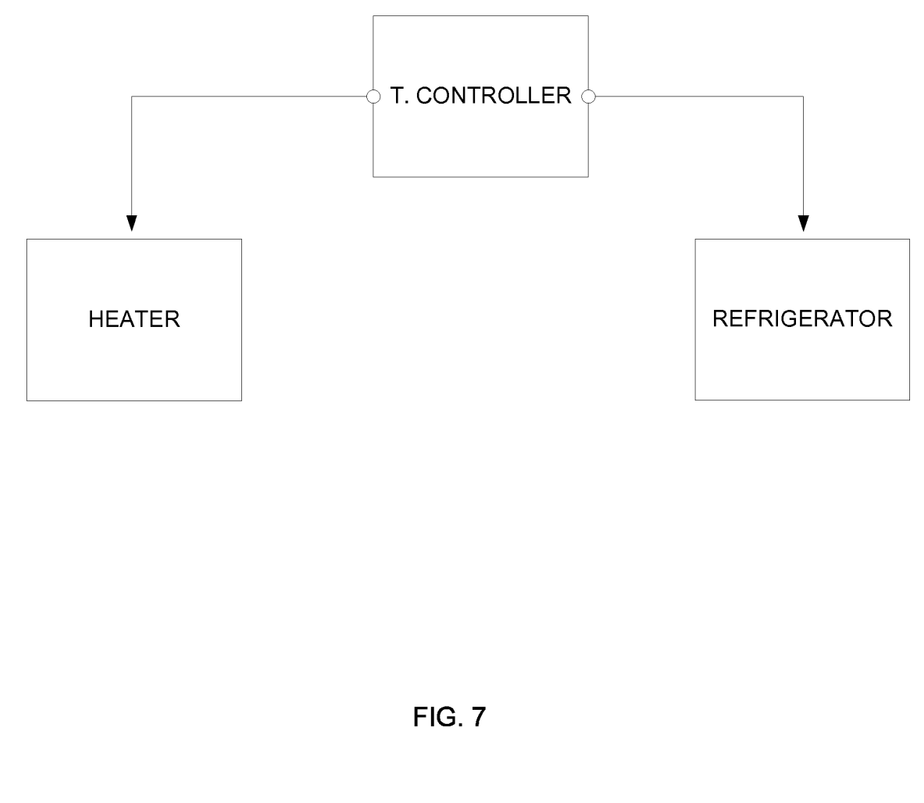
FIG. 7 is a schematic diagram showing a temperature controller with two outputs that operate in a complementary fashion in accordance with an exemplary embodiment of the invention.

In such an embodiment a temperature controller with two outputs that operate in a complementary fashion may be used. One output may be configured to control the air heater, while the other output may be configured to control the solenoid valve, as shown in FIG. 7. Since only one operation on the air—either cooling or heating—is required at any given time in this exemplary embodiment, only one controller output operates at a time, resulting in energy-efficient performance and providing for asynchronous, i.e. not occurring at the same time, heating and cooling of air within the temperature testing device.

Referring back to FIG. 3, the solenoid valve may be placed in the second stage refrigeration circuit (suction tube), between the stage evaporator and compressor. This results in unloading the compressor. When the valve is closed (i.e., no refrigerant flows in the circuit), the compressor has no refrigerant to pump and the pressure figures on both sides of the compressor—the low-pressure side and the high-pressure side—are reduced as compared to their normal cooling pressures. Upon opening the valve, however, the cooling process is instantly resumed as required by the user. Opening the valve permits refrigerant to flow to the evaporator, where it cools the air entering the chamber.

Ancillary Design Considerations for the Closed-Loop System

Vapor Sealing.

Air from the test chamber and from outside the system is typically normal ambient air that contains moisture. This moisture is driven to the cold components of the embodiments of the system where it condenses. The condensate over time may corrode thermal insulation of the embodiments. One purpose of the vapor sealing is to address this issue. In an exemplary embodiment, both the system enclosure (that contains the air blower, the cold heat exchanger and all associated controlled temperature air components) and the cold-heat exchanger enclosure are soldered assemblies. Where soldering is not possible or desirable, other sealing mechanisms, such as silicone rubber gaskets or silicone rubber sealant, may be used in mechanical assemblies to provide for the required vapor sealing.

Blower Motor Shaft Seal—

The air blower of exemplary embodiments is disposed inside the embodiments' galvanized steel enclosure. However, the blower motor is disposed outside the enclosure, because the motor generally cannot operate at the extreme temperatures controllably maintained within the enclosure by the closed-loop system of exemplary embodiments. A motor shaft, penetrating through the enclosure therefore should be appropriately sealed to prevent temperature exchange between the inner atmosphere of the enclosure and the outside. In one embodiment, the shaft sealing may be implemented using a polished stainless steel disk placed onto the motor shaft, which, in turn, rubs on a polished Rulon thrust washer mounted on the system enclosure. The thrust washer floats on a silicone sponge washer. In operation, the sponge washer is compressed against the enclosure and thus provides a seal between the enclosure and the thrust washer. In addition, the compressed sponge washer acts as a spring maintaining the stainless steel rotating disk and the Rulon thrust washer in intimate contact. Other sealing mechanisms may be used in various alternative embodiments.

Motor Sealing—

A secondary blower motor vapor seal, if necessary or desirable, may be implemented by sealing all motor holes and providing a sponge seal between the shaft end of the motor and the enclosure of an embodiment of the invention. To implement a required sealing, either the Motor Shaft seal or the Total Motor seal could be sufficient, but both are used to make certain no water vapor enters the system enclosure and compromises the effectiveness of the thermal insulation. Other sealing mechanisms may be used.

Test Chamber—

Vapor sealing arrangements may be made to provide for appropriate disengagement between the ambient of the test chamber and the surrounding environments.

Condensate Disposal—

In one embodiment, the system includes a condensate drain located in the enclosure of the cold-heat exchanger. Any condensate that forms (due to air leaks in the system air circuitry or the test chamber) on the cold-heat exchanger can drain through a drain trap into an external drain pan. Once collected in the external drain pan, the condensate will generally evaporate, driven by the condenser fan located outside the system enclosure.

Control of Capacity of the First Stage of Cooling—

As described above, according to one embodiment of the invention, the second stage of the cascade refrigeration system may be shut down during air-heating cycle (e.g., by shutting the solenoid valve), thus reducing the amount of cooling required from the cascade first stage. A capillary tube of FIG. 3, however, may not automatically reduce the cooling capacity of the first stage and liquid refrigerant may flow back to the compressor. This back-flow may be noisy and worrisome to system users. To this end, a thermostatic-expansion valve may be used in place of a less costly capillary tube, as depicted in FIG. 4. In some specific embodiments, the thermostatic-expansion valve may be additionally equipped with a small built-in bypass leak arrangement, thus facilitating reduction of time required to balance the pressure of the first-stage compressor and the compressor restart time.

Life of the Solenoid Valve—

An exemplary embodiment of the System Temperature Controller is set to a short ten second cycle for the solenoid-valve-controlled cooling. This cycle time has proved to provide optimal control of the cooling cycle. In addition, it also reduces the time of operation of the solenoid valve therefore enhancing its operational life. The expected valve life of 1,000,000 cycles should provide ten or more years of trouble free operation.

Condenser, Compressors, Blower Motor & Condenser Fan Motor Cooling—

In an exemplary embodiment, the Condenser Fan draws room air through the condenser, across the Condenser Fan Motor and the Blower Motor and then up through the cascade compressors, following by the exhaust to the room.

System Service—

Generally speaking, the only routine service required is occasional oiling of the condenser fan motor and the blower motor bearings. Both motors are easily accessible. In the unlikely event that the Condenser Fan Motor, the Blower Motor or the Rulon thrust washer seal require replacement, all are easily accessible. Higher thermal capacity refrigeration compressors may be used to increase cooling capacity with few other changes necessary. A twisted-tube heat exchanger may be used in place of the smooth-surface air-cooling heat exchanger in some embodiments. This should provide enhanced cooling capacity with no other system changes.

Figure 6:
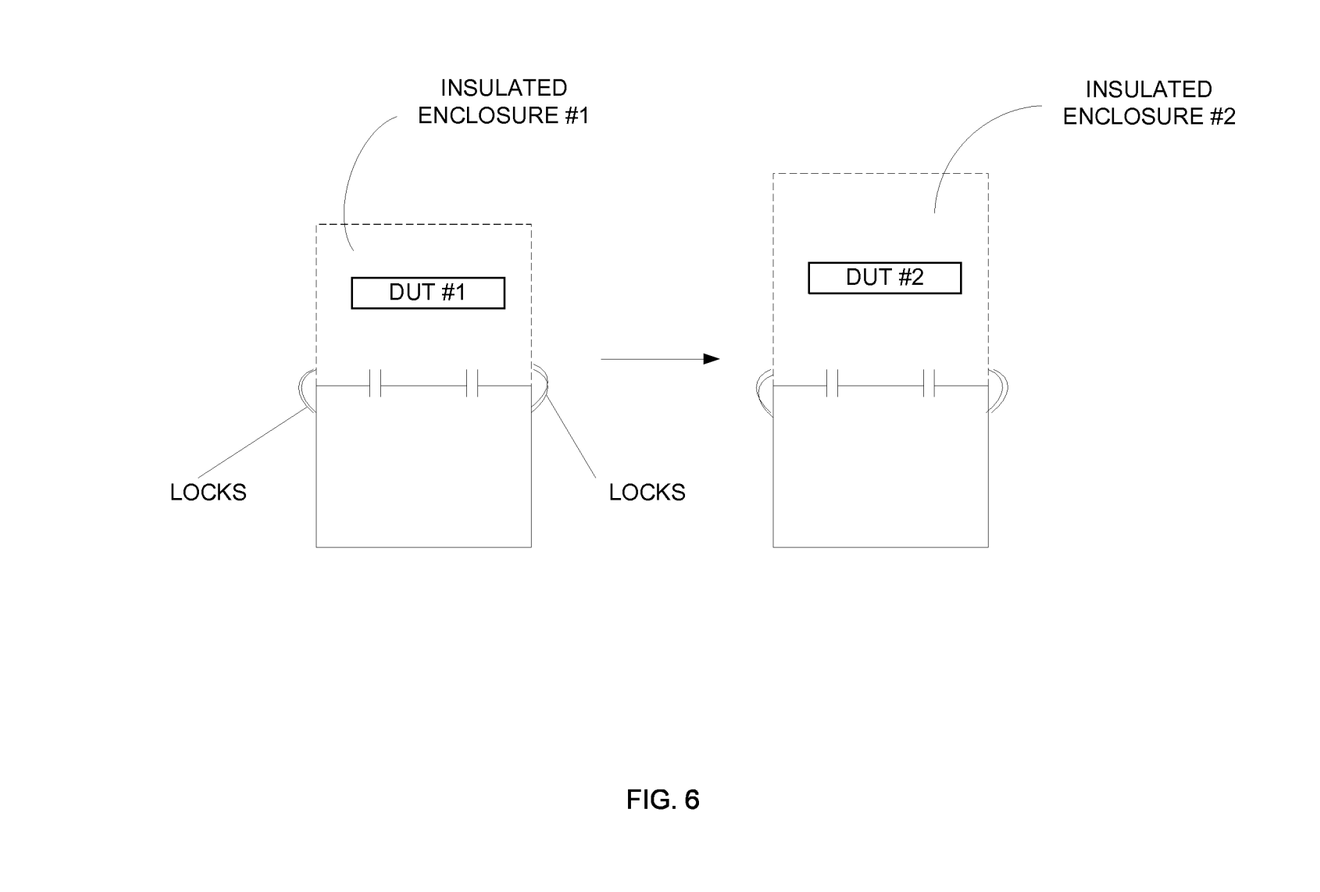
FIG. 6 is a schematic diagram showing a representation of interchangeable, removable chamber cavities in accordance with an exemplary embodiment of the invention.

Certain embodiments of the invention include interchangeable, removable chamber cavities, as represented in FIG. 6 and described in the related provisional application incorporated by reference above. Such embodiments differ from systems available in the art in that conventional systems utilize chambers designed for specific use and are characterized by open-loop controlled temperature air sources. The conventional systems typically provide temperature control within different ranges that depend on a particular application, with the maximum temperature determined by the size of the heater and materials used in chamber construction. One of the temperature-range standards known in the art is the range between approximately −55 degrees C. and +225 degrees C. Some advantages in performance and cost that embodiments of the invention provide in comparison with the conventionally used systems will become apparent from the following description.

Open-loop air source systems that may, in some embodiments, cool 18 SCFM of dry air to −80 degrees C., consist of a relatively large cascaded refrigeration system, a PID temperature controller, a separate large volume air compressor (approximately 23 SCFM at 90 PSIG) and a compressed air dryer. In such conventional systems, dry compressed air is cooled to −80 degrees C., reheated to the chamber control temperature by a high-wattage heater, sent into the test chamber, and then vented to the environment. Because of the relatively low air volume, baffles and/or manifolds within the chamber to achieve good temperature uniformity may be required.

| Air Source* | | | | |
|---|---|---|---|---|
| | Consumed Power | Size | Weight | Cost |
| Open-Loop System | 230 V/30 A | 24" × 30" × 48" | 500 lbs | >$30k |
| Closed-Loop System | 120 V/20 A | 20" × 24" × 28" | 200 lbs | $10k |

*The OPEN LOOP Air Source includes the Air Heater & the Air Dryer

| Air Compressor | | | | |
|---|---|---|---|---|
| | Consumed Power | Size | Weight | Cost |
| Open-Loop System | 230 V/30 A | 31" × 20" × 80" | 496 lbs | $1.5k |
| Closed-Loop System | | None | | |

Although the solenoid valve is shown on the return side of the coolant flow path in FIG. 3, it should be noted that the solenoid valve may be positioned on the supply side of the coolant flow path in an alternative embodiment.

Although various exemplary embodiments are shown with reference to a closed-loop control system, it should be noted that the coolant control scheme described above may also be used in open-loop control systems, specifically by including an electronically controlled valve in the coolant flow path, leaving the compressor(s) on during steady state operation, and controlling cooling via the valve.

Although an exemplary embodiment is described above with reference to a thermal fixture having interchangeable, removable chamber cavities, it should be noted that the present invention is not limited to such thermal fixtures.

The embodiments of the invention described above are intended to be merely exemplary; numerous variations and modifications will become apparent to those skilled in the art based on the teachings of this application. All such variations and modifications are intended to be within the scope of the present invention.

What is claimed is:

1. A thermal fixture for use with interchangeable, removable thermal chambers having different sizes or shapes, the thermal chambers including a generic interface adapter, the thermal fixture comprising:
 a compressor system for compressing a coolant;
 a heat exchanger system for at least selectively cooling a flow of air, the heat exchanger system including an evaporator in fluid communication with the compressor system via a coolant flow path through which the coolant can flow from the compressor system to the evaporator and back to the compressor system;
 an electronically controllable valve disposed in the coolant flow path for selectively enabling and disabling the flow of coolant through the coolant flow path when the compressor system is running, wherein closing the valve disables flow of coolant through the compressor system and opening the valve enables flow of coolant through the compressor system;
 a heater for selectively heating the flow of air;
 an interface receiver configured for docking of the generic interface adapter of a thermal chamber, the interface receiver including mating connections that mate with corresponding mating connections of the generic interface adapter, the mating connections conveying supply air to the thermal chamber and return air from the thermal chamber, the interface receiver accommodating thermal chambers having different sizes or shapes; and
 a controller operably coupled to the compressor system, the valve, and the heater, wherein the controller is configured to operate, during a steady state operation in which the compressor system is left on, (1) a cooling cycle in which the compressor system is running, the heater is disabled, and the flow of coolant through the compressor system is enabled via the valve and (2) a heating cycle in which the compressor system is running, the heater is enabled, and the flow of coolant through the compressor system is disabled via the valve, wherein the thermal fixture is capable of producing air temperatures in the thermal chamber ranging from around −55 degrees C. to +225 degrees C.

2. A thermal fixture according to claim 1, wherein the electronically controllable valve is a solenoid valve.

3. A thermal fixture according to claim 1, wherein the electronically controllable valve is a binary valve having a first selectable configuration that enables flow of coolant through the coolant flow path and a second selectable configuration that disables flow of coolant through the coolant flow path.

4. A thermal fixture according to claim 1, wherein the electronically controllable valve is a variable valve.

5. A thermal fixture according to claim 1, wherein the compressor system includes a cascaded compressor arrangement having a first stage compressor and a second stage compressor, the second stage compressor in fluid communication with the evaporator via the coolant flow path.

6. A thermal fixture according to claim 1, wherein the controller is a proportional-integral-derivative (PID) controller that is configured to control the valve based at least in part on temperature of the flow of air.

7. A thermal fixture according to claim 1, further comprising a thermal chamber with generic interface adapter docked in the interface receiver.

* * * * *